United States Patent
Wun et al.

(10) Patent No.: US 11,022,521 B2
(45) Date of Patent: Jun. 1, 2021

(54) TEST DEVICE AND HETEROGENEOUSLY INTEGRATED STRUCTURE

(71) Applicant: Industrial Technology Research Institute, Hsinchu (TW)

(72) Inventors: Sin-Jhu Wun, Hsinchu (TW); Shang-Chun Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/702,564

(22) Filed: Dec. 4, 2019

(65) Prior Publication Data

US 2021/0102866 A1 Apr. 8, 2021

(30) Foreign Application Priority Data

Oct. 4, 2019 (TW) ................................ 108136082

(51) Int. Cl.
*G01M 11/00* (2006.01)
*G02B 6/42* (2006.01)

(52) U.S. Cl.
CPC ........... *G01M 11/33* (2013.01); *G02B 6/4214* (2013.01); *G02B 6/4286* (2013.01)

(58) Field of Classification Search
None
See application file for complete search history.

(56) References Cited

U.S. PATENT DOCUMENTS

| | | | |
|---|---|---|---|
| 6,224,269 B1 | 5/2001 | Engstrand et al. | |
| 6,719,927 B2 | 4/2004 | Sakurai et al. | |
| 7,298,941 B2 | 11/2007 | Palen et al. | |
| 7,455,463 B2 | 11/2008 | Togami et al. | |
| 8,412,052 B2 | 4/2013 | Mohammed | |
| 9,146,365 B1 | 9/2015 | Oki et al. | |
| 9,341,786 B1 * | 5/2016 | Gamache | G02B 6/4246 |
| 9,459,177 B1 | 10/2016 | Dong et al. | |

(Continued)

FOREIGN PATENT DOCUMENTS

| | | |
|---|---|---|
| CN | 103217740 | 7/2013 |
| EP | 1459865 | 3/2011 |

(Continued)

OTHER PUBLICATIONS

"Office Action of Taiwan Counterpart Application", dated Mar. 19, 2020, p. 1-p. 4.

(Continued)

*Primary Examiner* — Chad H Smith
(74) *Attorney, Agent, or Firm* — JCIPRNET

(57) ABSTRACT

A test device configured to test a photonic integrated circuit (IC) is provided. The photonic IC includes at least one waveguide edge coupler, and the test device includes an optical coupler. The optical coupler is configured to be optically aligned with the photonic IC, and includes at least one focusing lens and a first reflector. The at least one focusing lens is aligned with the at least one waveguide edge coupler. A light from the waveguide edge coupler is focused by the focusing lens, reflected by the first reflector, and transmitted to a fiber connector in sequence, or a light from the fiber connector is reflected by the first reflector and focused onto the waveguide edge coupler by the focusing lens in sequence. A heterogeneously integrated structure is also provided.

18 Claims, 10 Drawing Sheets

(56) References Cited

U.S. PATENT DOCUMENTS

| | | | |
|---|---|---|---|
| 9,880,366 B2 | 1/2018 | Vallance et al. | |
| 10,145,758 B2 | 12/2018 | Traverso et al. | |
| 2004/0013359 A1 | 1/2004 | Lee et al. | |
| 2004/0101259 A1* | 5/2004 | Kilian | G02B 6/4214 |
| | | | 385/93 |
| 2006/0118893 A1* | 6/2006 | Behfar | H01L 31/153 |
| | | | 257/414 |
| 2006/0239605 A1 | 10/2006 | Palen et al. | |
| 2006/0251360 A1 | 11/2006 | Lu | |
| 2011/0206379 A1* | 8/2011 | Budd | H04B 10/801 |
| | | | 398/116 |
| 2015/0037044 A1 | 2/2015 | Peterson | |
| 2017/0082799 A1 | 3/2017 | Novack | |
| 2019/0227246 A1 | 7/2019 | Fish et al. | |

FOREIGN PATENT DOCUMENTS

| | | |
|---|---|---|
| JP | 2002525699 | 8/2002 |
| JP | 2010251649 | 11/2010 |
| KR | 20110105605 | 9/2011 |
| TW | 201337371 | 9/2013 |
| TW | 201606374 | 2/2016 |
| WO | 2019010349 | 1/2019 |

OTHER PUBLICATIONS

"Office Action of Japan Counterpart Application", dated Mar. 2, 2021, p. 1-p. 2.

* cited by examiner

TEST DEVICE AND HETEROGENEOUSLY INTEGRATED STRUCTURE

CROSS-REFERENCE TO RELATED APPLICATION

This application claims the priority benefit of Taiwan application serial no. 108136082, filed on Oct. 4, 2019. The entirety of the above-mentioned patent application is hereby incorporated by reference herein and made a part of this specification.

BACKGROUND

Technical Field

The technical field relates to a test device and a heterogeneously integrated structure.

Description of Related Art

In general semiconductor production processes, the wafer acceptance test (WAT) is a common in-line test to be used as the basis for determining the quality of the manufacturing process and determining whether a die is good or bad, and also as a direct evidence for monitoring process variation.

On the other hand, production of a silicon waveguide of a photonic integrated circuit (IC) will encounter several issues different from conventional semiconductor production, including: 1. The layout is more difficult, and design rule checking is more complicated; 2. the structural roughness and the etching depth resulted from the manufacturing process are more sensitive; 3. it is not easy to determine the result quickly, since the measurement method of light inputs and light outputs is more complicated than electrical measurement.

For a photonic IC, a wafer-level test is generally performed with a surface coupler (e.g., a grating), and an edge coupler is generally suitable for a chip-level test.

Compared to the edge coupler, the surface coupler has a larger optical loss and a narrower bandwidth to be accommodated and is limited by the polarization direction, but it is often adopted in silicon photonic processes because it can be subjected to wafer-level testing.

However, if the photonic IC process can only adopt chip-level testing and packaging due to the use of the edge coupler, it is likely that the manufacturing process will become complicated, the manufacturing cost and time will increase, and hence lower the productivity.

SUMMARY

An embodiment of the disclosure provides a test device configured to test a photonic IC. The photonic IC includes at least one waveguide edge coupler, and the test device includes an optical coupler. The optical coupler is configured on the photonic IC and optically aligned with the photonic IC. The optical coupler includes at least one focusing lens and a first reflector. The at least one focusing lens is aligned with the at least one waveguide edge coupler. A light from the waveguide edge coupler is focused by the focusing lens, reflected by the first reflector, and transmitted to a fiber connector in sequence, or a light from the fiber connector is reflected by the first reflector and focused onto the waveguide edge coupler by the focusing lens in sequence.

An embodiment of the disclosure provides a heterogeneously integrated structure, including a photonic IC and an optical coupler. The photonic IC includes at least one waveguide edge coupler, and the optical coupler is heterogeneously integrated onto the photonic IC. The optical coupler includes at least one focusing lens and a first reflector. The at least one focusing lens is aligned with the at least one waveguide edge coupler. A light from the waveguide edge coupler is focused by the focusing lens, reflected by the first reflector, and transmitted to a fiber connector in sequence, or a light from the fiber connector is reflected by the first reflector and focused onto the waveguide edge coupler by the focusing lens in sequence.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
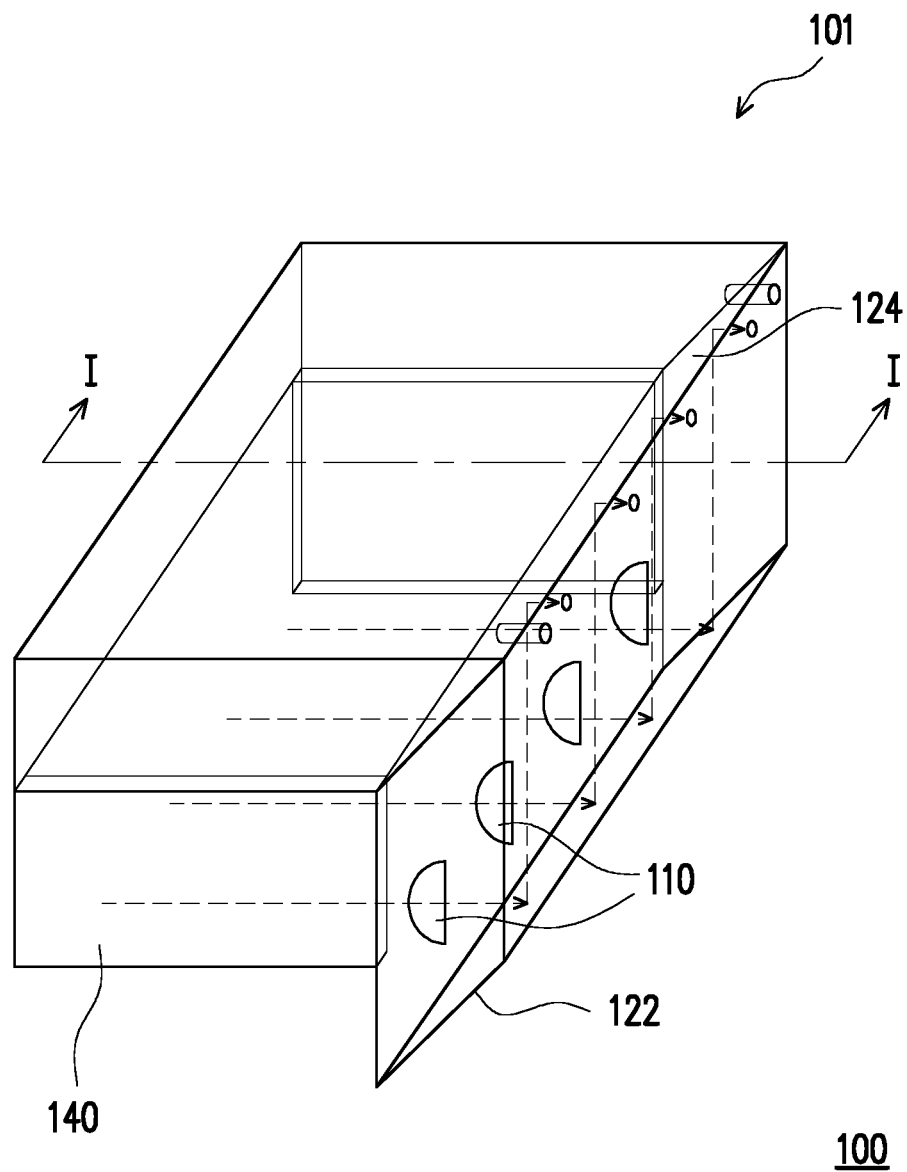
FIG. 1A is a schematic perspective view showing a test device according to an embodiment of the disclosure.
Figure 1B:
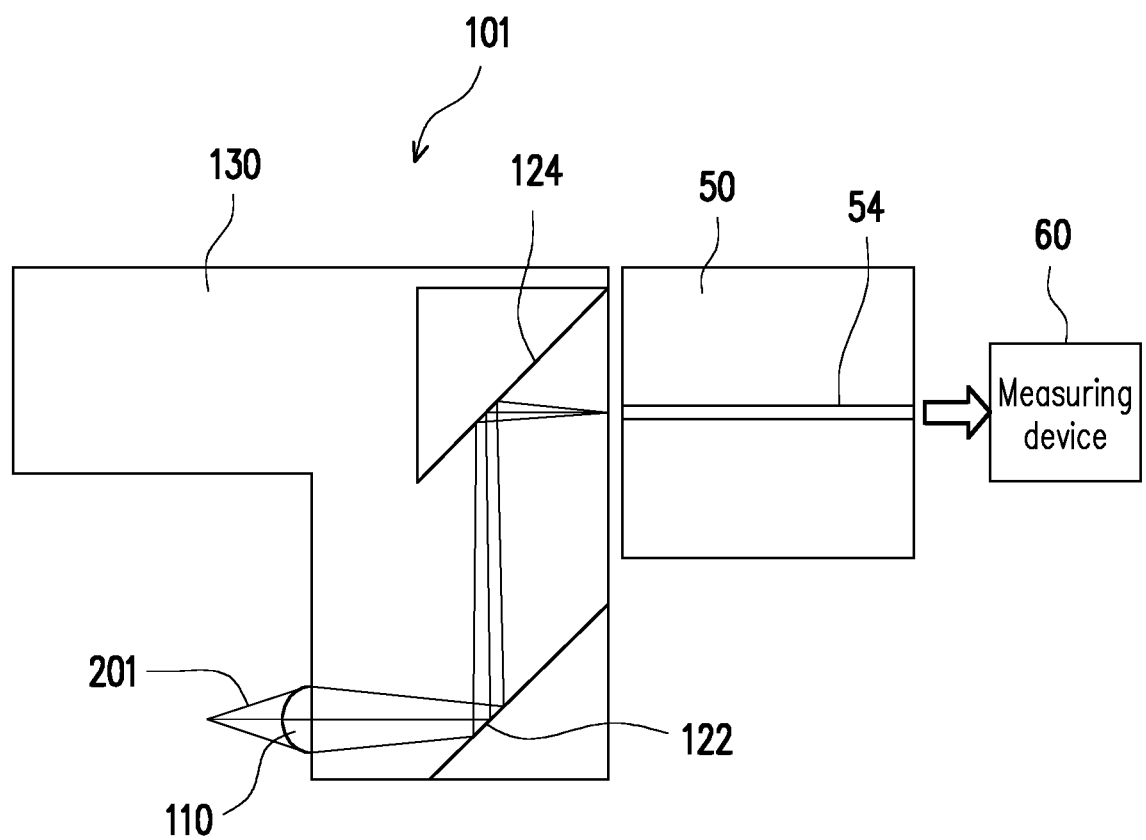
FIG. 1B is a schematic cross-sectional view showing the test device of FIG. 1A along line I-I.
Figure 1C:
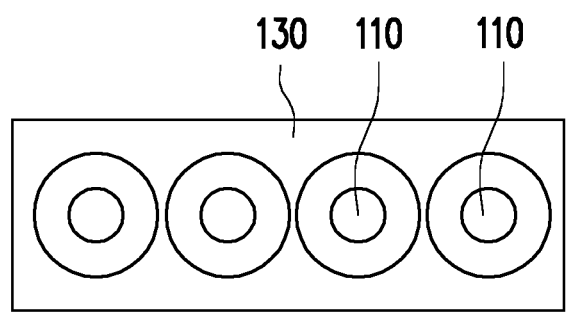
FIG. 1C is a schematic front view showing a focusing lens viewed from the left side of FIG. 1A.
Figure 2A:
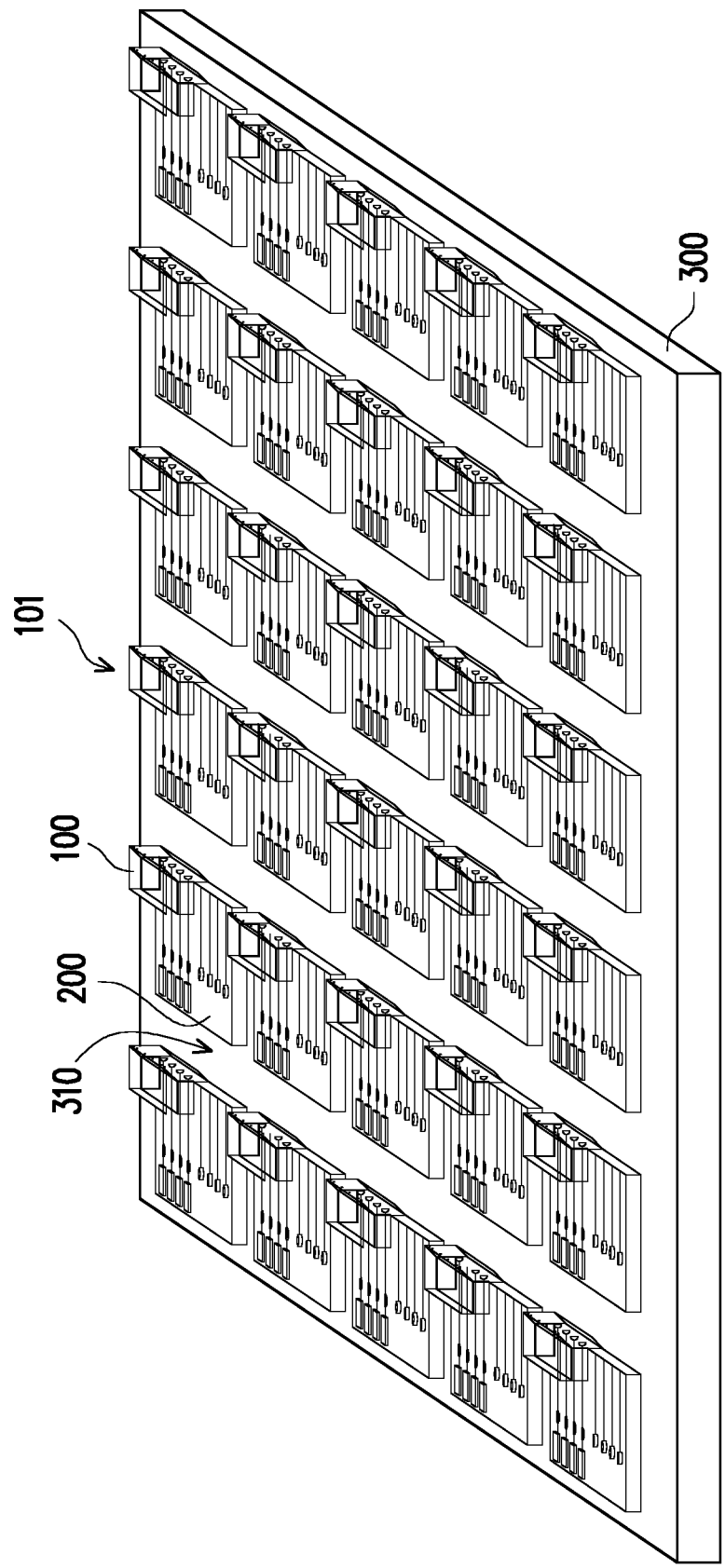
FIG. 2A is a schematic perspective view showing a plurality of photonic ICs on a wafer respectively measured by a plurality of the test devices of FIG. 1A.
Figure 2B:
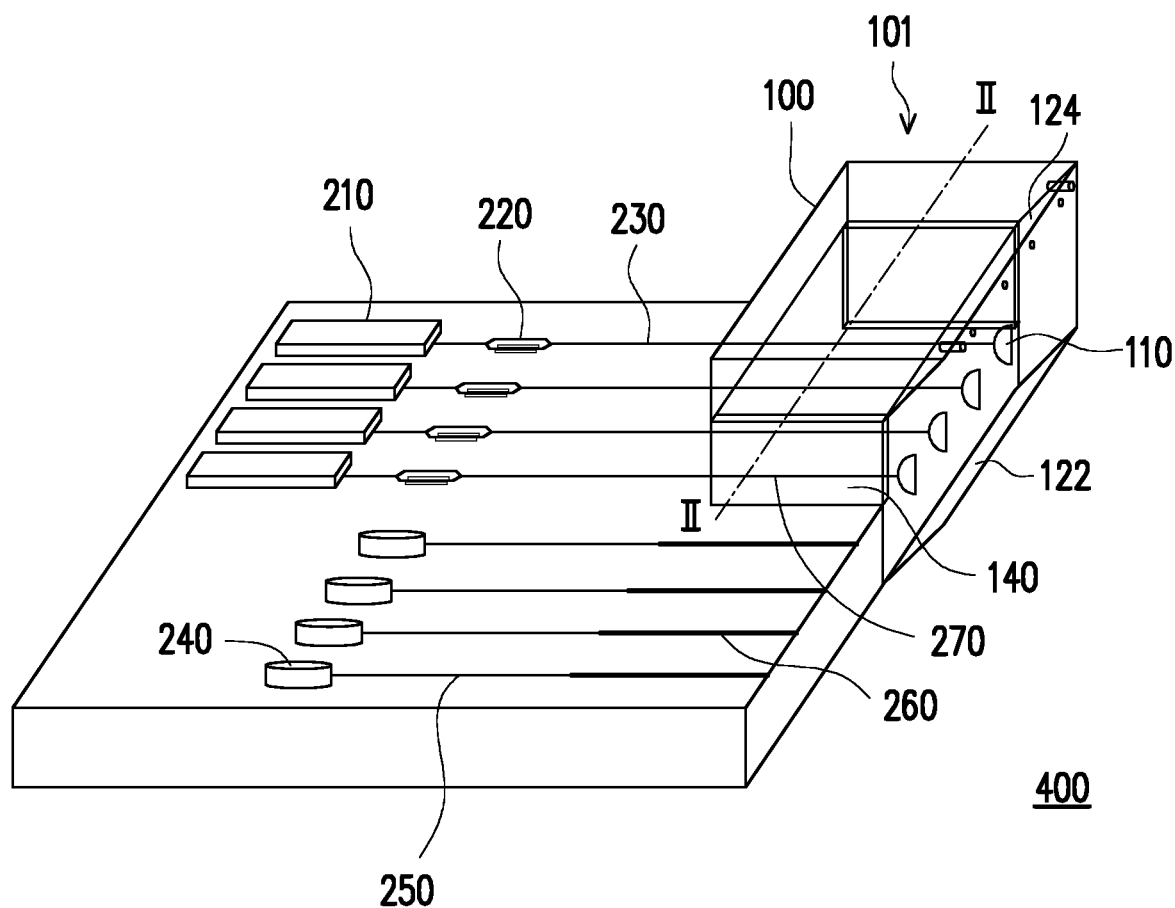
FIG. 2B is a schematic enlarged perspective view showing measurement of one of the photonic ICs on the wafer by one of the test devices in FIG. 2A.
Figure 2C:
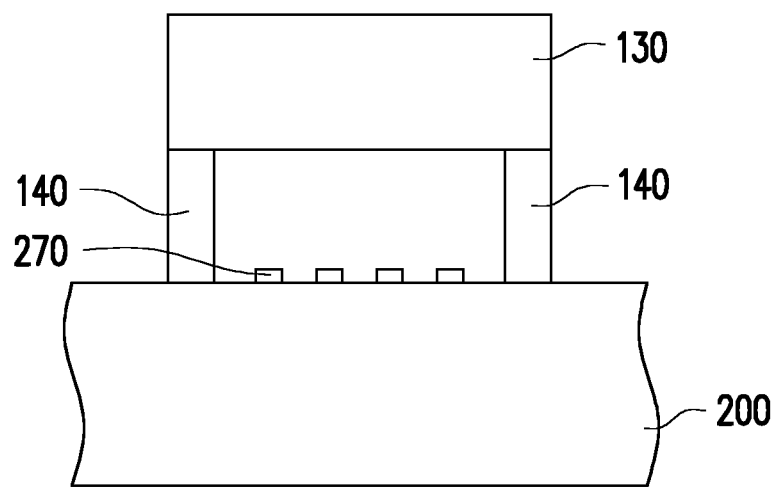
FIG. 2C is a schematic cross-sectional view showing the test device and the photonic IC in FIG. 2B along line II-II.

FIG. 1A is a schematic perspective view showing a test device according to an embodiment of the disclosure, FIG. 1B is a schematic cross-sectional view showing the test device of FIG. 1A along line I-I, and FIG. 1C is a schematic front view showing a focusing lens viewed from the left side of FIG. 1A. FIG. 2A is a schematic perspective view showing a plurality of photonic ICs on a wafer respectively measured by a plurality of the test devices of FIG. 1A, FIG. 2B is a schematic enlarged perspective view showing measurement of one of the photonic ICs on the wafer by one of the test devices in FIG. 2A, and FIG. 2C is a schematic cross-sectional view showing the test device and the photonic IC in FIG. 2B along line II-II. Referring to FIG. 1A to FIG. 2C, a test device 100 of the present embodiment is configured to test a photonic IC 200. The photonic IC 200 may be provided with a laser source 210, silicon waveguides 230 and 250, a modulator 220, waveguide edge couplers 260 and 270, and a photodetector 240. The modulator 220 is, for example, a Mach-Zehnder modulator.

The photonic IC 200 includes at least one waveguide edge coupler 270 (a plurality of waveguide edge couplers 270 are shown in FIG. 2A to FIG. 2C as an example), and the test device 100 includes an optical coupler 101. The optical coupler 101 is disposed on the photonic IC 200 and is optically aligned with the photonic IC 200, or the optical coupler 101 is heterogeneously integrated onto the photonic IC 200. Heterogeneous integration (HI) refers to the assembly and packaging of multiple separately fabricated components onto one chip to enhance functional and operational properties.

The optical coupler 101 includes at least one focusing lens 110 (a plurality of focusing lenses 110 are shown in FIG. 1A and FIG. 2B as an example) and a first reflector 122. The focusing lenses 110 are respectively aligned with the waveguide edge couplers 270, and a light 201 from the waveguide edge coupler 270 is focused by the focusing lens 110, reflected by the first reflector 122, and transmitted to a fiber connector 50 (as shown in FIG. 1B) in sequence. Alternatively, the focusing lenses 110 may also be respectively aligned with the waveguide edge couplers 260, and a light from the fiber connector 50 is reflected by the first reflector 122 and focused onto the waveguide edge coupler 260 by the focusing lens 110 in sequence.

In the present embodiment, the optical coupler 101 further includes a second reflector 124. When the focusing lenses 110 are respectively aligned with the waveguide edge couplers 270, the light 201 emitted by the laser source 210 passes through the modulator 220, the silicon waveguide 230, and the waveguide edge coupler 270 in sequence and then focused by the focusing lens 110. Afterwards, the light 201 from the focusing lens 110 is reflected by the first reflector 122 to the second reflector 124, and the second reflector 124 reflects the light 201 reflected by the first reflector 122 to the fiber connector 50. An optical fiber 54 fixed by the fiber connector 50 transmits the light 201 reflected by the second reflector 124 to a measuring device 60. Accordingly, with the test device 100 supported on the photonic IC 200, the measuring device 60 can measure the optical properties of the photonic IC 200, for example, to determine whether the photonic IC 200 is a good chip or a bad chip. In the present embodiment, the measuring device 60 is, for example, an optical power meter. However, in other embodiments, the measuring device 60 may be another suitable optical measuring device.

When the focusing lenses 110 are respectively aligned with the waveguide edge couplers 260, the light emitted by an external light source may be transmitted to the second reflector 124 via the optical fiber 54 fixed by the fiber connector 50. The second reflector 124 reflects the light from the fiber connector 50 to the first reflector 122, and the first reflector 122 reflects the light reflected by the second reflector 124 to the focusing lens 110. Afterwards, the focusing lens 110 focuses the light onto the waveguide edge coupler 260, and then the light passes through the waveguide edge coupler 260 and the silicon waveguide 250 in sequence and transmitted to the photodetector 240. Through the electrical signal converted from light by the photodetector 240, it is possible to determine the optical properties of the photonic IC 200, for example, to determine whether the photonic IC 200 is a good chip or a bad chip. In the present embodiment, the photodetector 240 is, for example, a photodiode or another suitable photodetecting element.

In the present embodiment, the optical coupler 101 further includes a light-transmitting medium 130 covering the first reflector 122, and at least one curved surface of the light-transmitting medium 130 (a plurality of curved surfaces are shown in FIG. 1A as an example) forms the at least one lens 110 (a plurality of lenses 110 are shown in FIG. 1A as an example). The material of the light-transmitting medium 130 includes a polymer such as epoxy, and a light (e.g., the light 201) transmitted in the light-transmitting medium 130 is, for example, an infrared light.

In the present embodiment, the test device 100 further includes at least one support element 140 (two support elements 140 are shown in FIG. 1A and FIG. 2C as an example) connected to the light-transmitting medium 130. With the support element 140 supported on the surface of the photonic IC 200, the test device 100 can fix the relative positions of the waveguide edge coupler 270 or 260 and the focusing lens 110 (e.g., aligning the waveguide edge coupler 270 or 260 and the focusing lens 110 with each other in height).

In the present embodiment, when the focusing lenses 110 are respectively aligned with the waveguide edge couplers 270, the incident direction of the light 201 incident on the first reflector 122 is the same as the outgoing direction of the light 201 emitted from the second reflector 124. When the focusing lenses 110 are respectively aligned with the waveguide edge couplers 260, the incident direction of the light which comes from the fiber connector 50 and is incident on the second reflector 124 is the same direction as the outgoing direction of the light which comes from the second reflector 124 and is emitted from the first reflector 122. Herein, the "same direction" means that the included angle of the two directions falls within ±1.5 degrees. In the present embodiment, the first reflector 122 is inclined with respect to the traveling direction of the light 201 emitted from the waveguide edge coupler 270, or is inclined with respect to the traveling direction of the light incident to the waveguide edge coupler 260. In the present embodiment, the first reflector 122 and the second reflector 124 are reflective coating films such as metal films, and the first reflector 122 is, for example, parallel to the second reflector 124.

In the test device 100 of the present embodiment, since the optical coupler 101 optically alignable with the photonic IC 200 is adopted, a simplified measurement process and good measurement quality can be achieved, or a simple architecture can be used to achieve optical coupling to the outside. In addition, the test device 100, which is heterogeneously integrated with the photonic IC 200, may also serve as an optical coupler of the photonic IC 200 for coupling to the outside and remains on the finished product of the photonic IC 200 to form a heterogeneously integrated structure 400 together with the photonic IC 200, and the heterogeneously integrated structure 400 adopts a simple architecture to achieve good optical coupling to the outside. In other words, when the test device 100 is testing the photonic IC 200, the optical coupler 101 is configured on the photonic IC 200 and optically aligned with the photonic IC 200. After the test is completed, the test device 100 may be separated from the photonic IC 200. When the test device 100 is heterogeneously integrated with the photonic IC 200, the relative positions between the test device 100 and the photonic IC 200 are the same as the relative positions at the time of the test, but the test device 100 and the photonic IC 200 are packaged together and are not separated, so as to form the heterogeneously integrated structure 400.

In a test method according to an embodiment of the disclosure, the support element 140 of the test device 100 may be supported on the photonic IC 200 as described above such that the focusing lenses 110 are respectively aligned with the waveguide edge couplers 270 or 260 to achieve the optical measurement described above. In addition, the test device 100 and the test method of the present embodiment can achieve wafer-level testing. In other words, after forming a plurality of dies (i.e., the photonic ICs 200) on a wafer 300, a trench 310 may be formed between two adjacent dies (e.g., the trench 310 is formed by etching) to expose the side surface of photonic IC 200 so that the waveguide edge couplers 270 and 260 are exposed on the side surface. On the other hand, a plurality of test devices 100 arranged in an array may be fixed on a jig, and then these test devices 100 are respectively supported on the dies to respectively measure the optical properties of the dies as shown in FIG. 2A to thereby determine which dies are good dies and which are bad dies. Accordingly, in the subsequent process, it is possible to package only good dies and discard the bad dies without packaging them. For a photonic IC manufacturing process, the packaging cost is higher than the cost of the wafer manufacturing process. Therefore, wafer-level testing is adopted in the present embodiment to discard bad dies without packaging them, which can effectively reduce the overall manufacturing cost.

In addition, the present embodiment adopts the waveguide edge coupler 270 or 260 for optical coupling, so disadvantages of a surface coupler may not be present. In other words, the present embodiment can utilize the waveguide edge coupler to achieve wafer-level testing and can overcome the limitations of the conventional test method.

In the above embodiment, the focusing lenses 110 are respectively aligned with the waveguide edge couplers 270 or 260 as an example. However, in another embodiment, the number of the focusing lenses 110 may also be increased and the focusing lenses 110 may be simultaneously aligned with the waveguide edge couplers 270 and 260, respectively, to perform light output and light entry tests at the same time.

Figure 3:
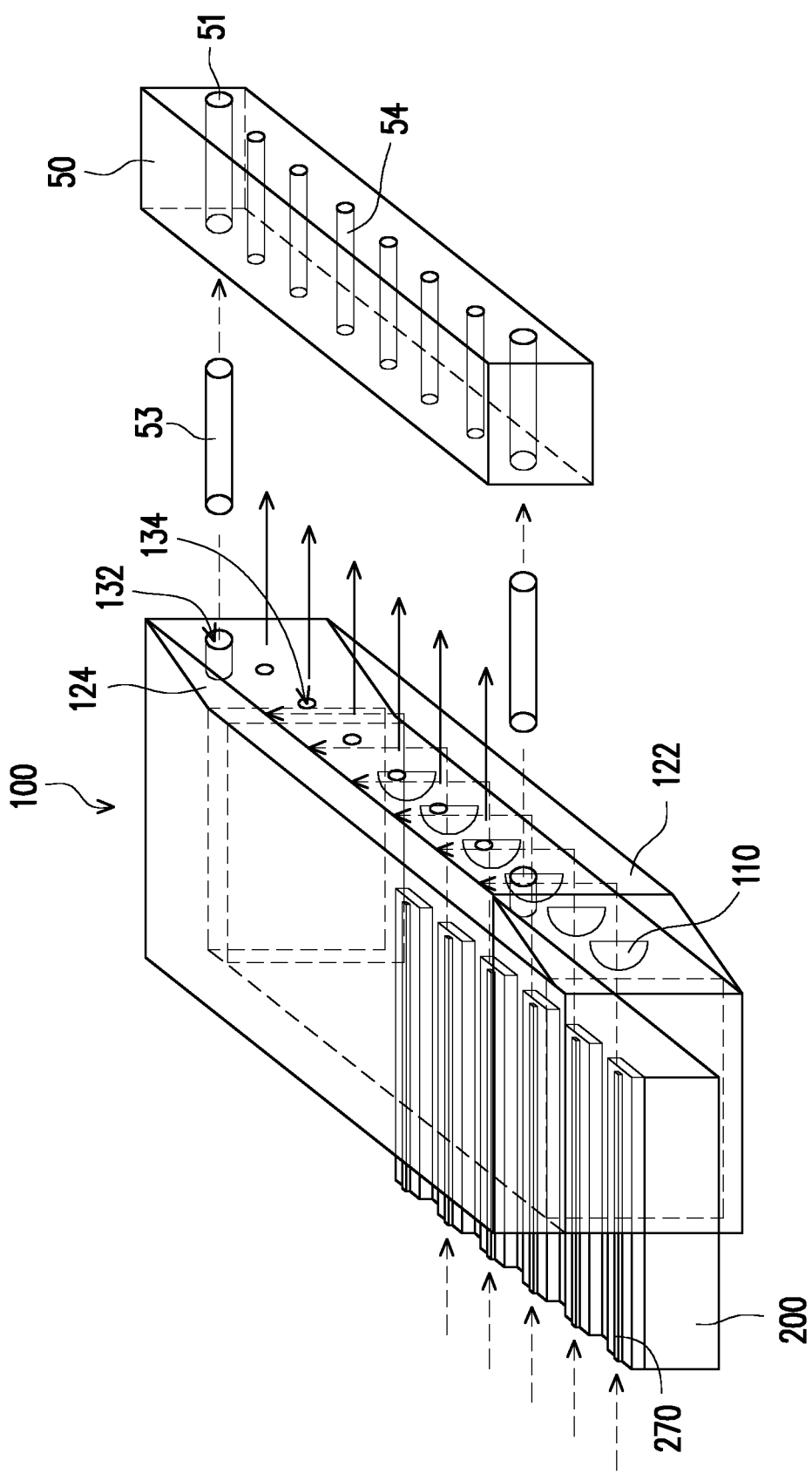
FIG. 3 is a schematic perspective view showing connection of the test device of FIG. 1A and a fiber connector.

FIG. 3 is a schematic perspective view showing connection of the test device of FIG. 1A and the fiber connector. Referring to FIG. 1A and FIG. 3, when the test device 100 is connected to the fiber connector 50, a plurality of guiding pins 53 may be utilized to fix the relative positions of the test device 100 and the fiber connector 50. One end of the guiding pin 53 may be inserted into a recess 132 on the test device 100 (e.g., a recess 132 on the light-transmitting medium 130), and the other end of the guiding pin 53 may be inserted into a through hole 51 on the fiber connector 50. In addition, one end of the optical fiber 54 fixed by the fiber connector 50 may be inserted into a recess 134 on the test device 100 (e.g., a recess 134 on the light-transmitting medium 130) to align the light path.

Figure 4A:
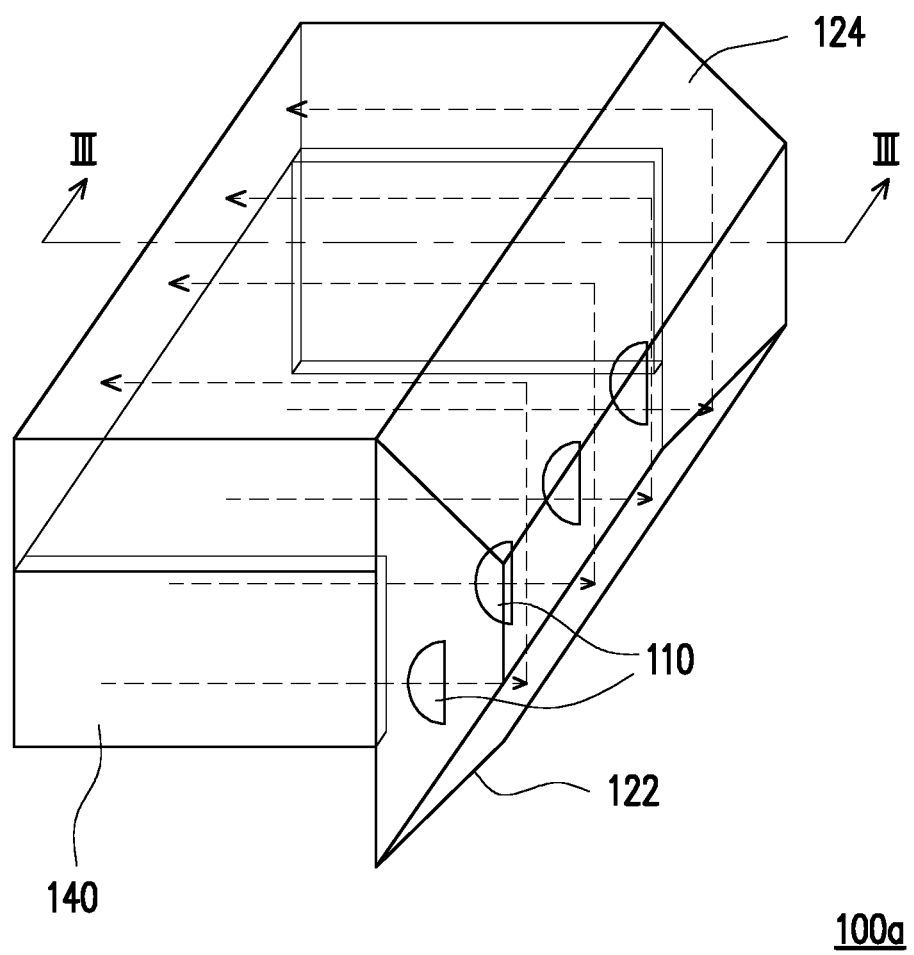
FIG. 4A is a schematic perspective view showing a test device according to another embodiment of the disclosure.
Figure 4B:
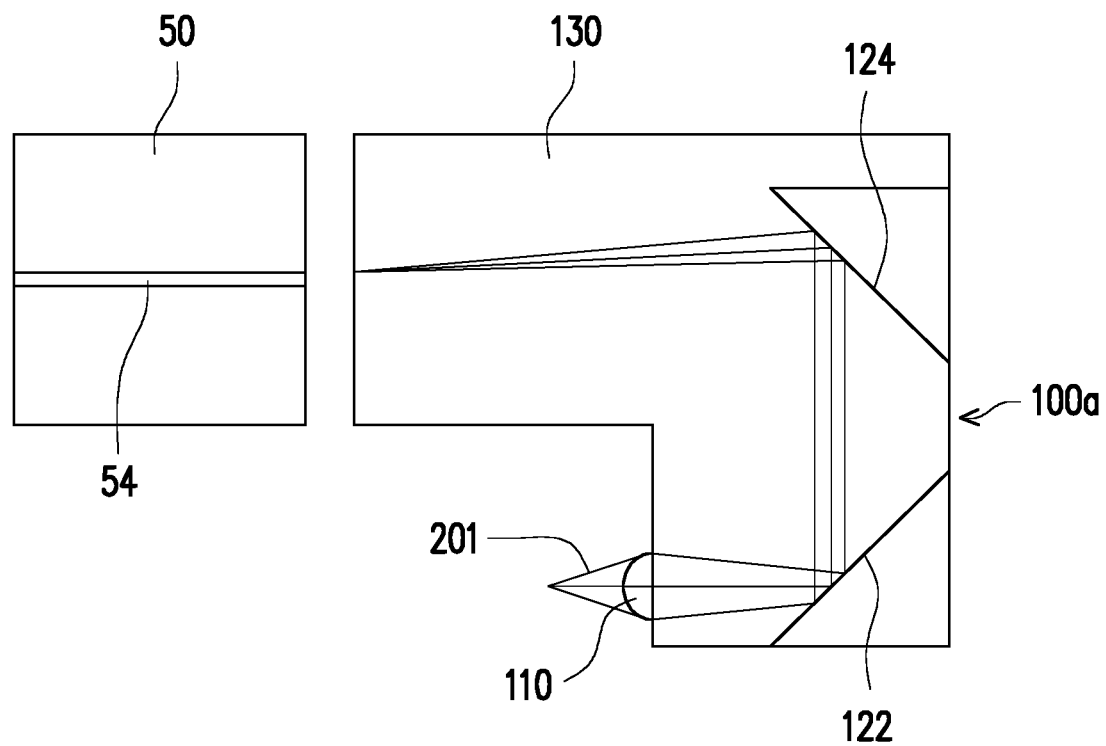
FIG. 4B is a schematic cross-sectional view showing the test device of FIG. 4A along line III-III.
Figure 4C:
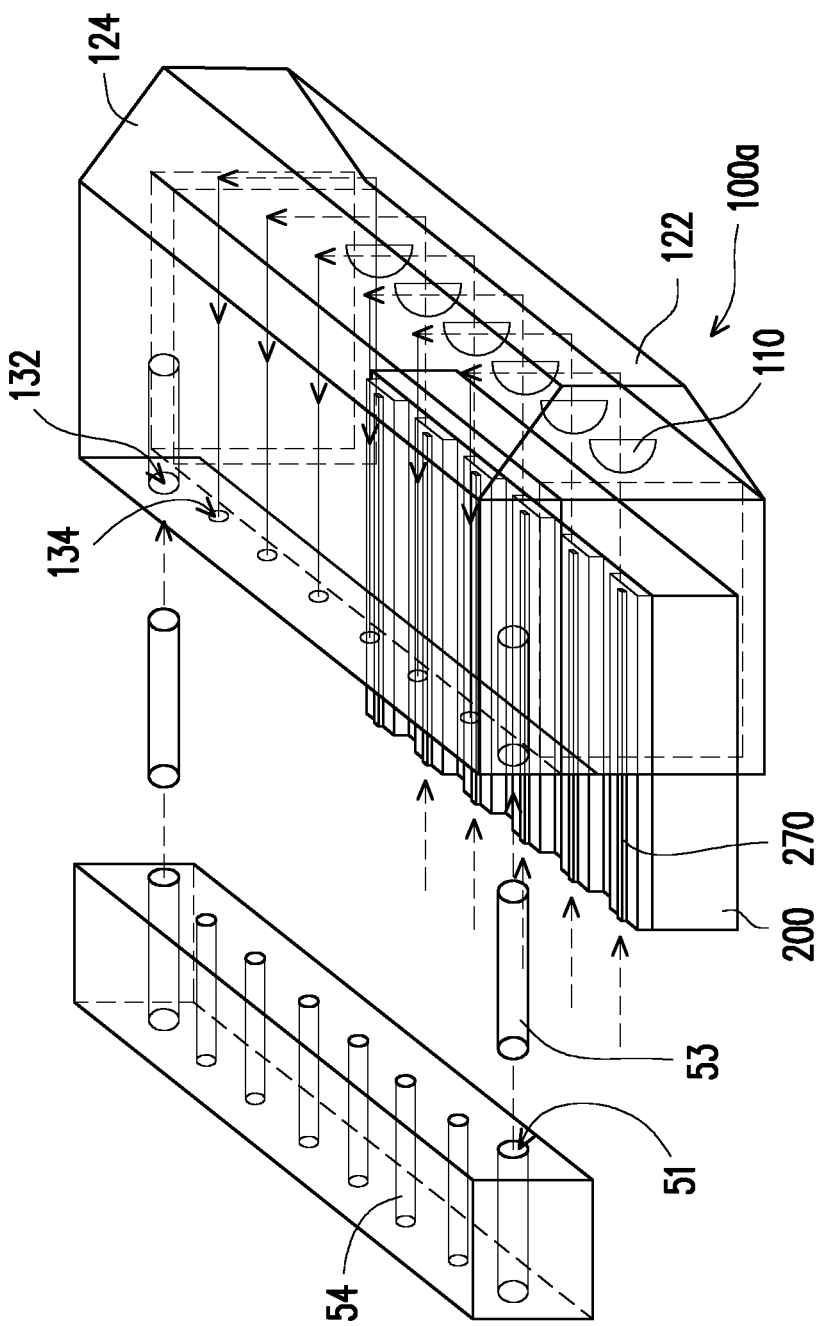
FIG. 4C is a schematic perspective view showing connection of the test device of FIG. 4A and the fiber connector.

FIG. 4A is a schematic perspective view showing a test device according to another embodiment of the disclosure, FIG. 4B is a schematic cross-sectional view showing the test device of FIG. 4A along line III-III, and FIG. 4C is a schematic perspective view showing connection of the test device of FIG. 4A and the fiber connector. Referring to FIG. 2B and FIG. 4A to FIG. 4C, a test device 100a of the present embodiment is similar to the test device 100 of FIG. 1A to FIG. 3, and the main differences between the two are as follows. In the test device 100a of the present embodiment, when the focusing lenses 110 are respectively aligned with the waveguide edge couplers 270, the incident direction of the light 201 incident on the first reflector 122 is the opposite direction of the outgoing direction of the light 201 emitted from the second reflector 124. When the focusing lenses 110 are respectively aligned with the waveguide edge couplers 270, the incident direction of the light which comes from the fiber connector 50 and is incident on the second reflector 124 is the opposite direction of the outgoing direction of the light which comes from the second reflector 124 and is emitted from the first reflector 122. Herein, the "opposite direction" means that the included angle of the two directions falls within the range of 180±1.5 degrees.

Figure 5A:
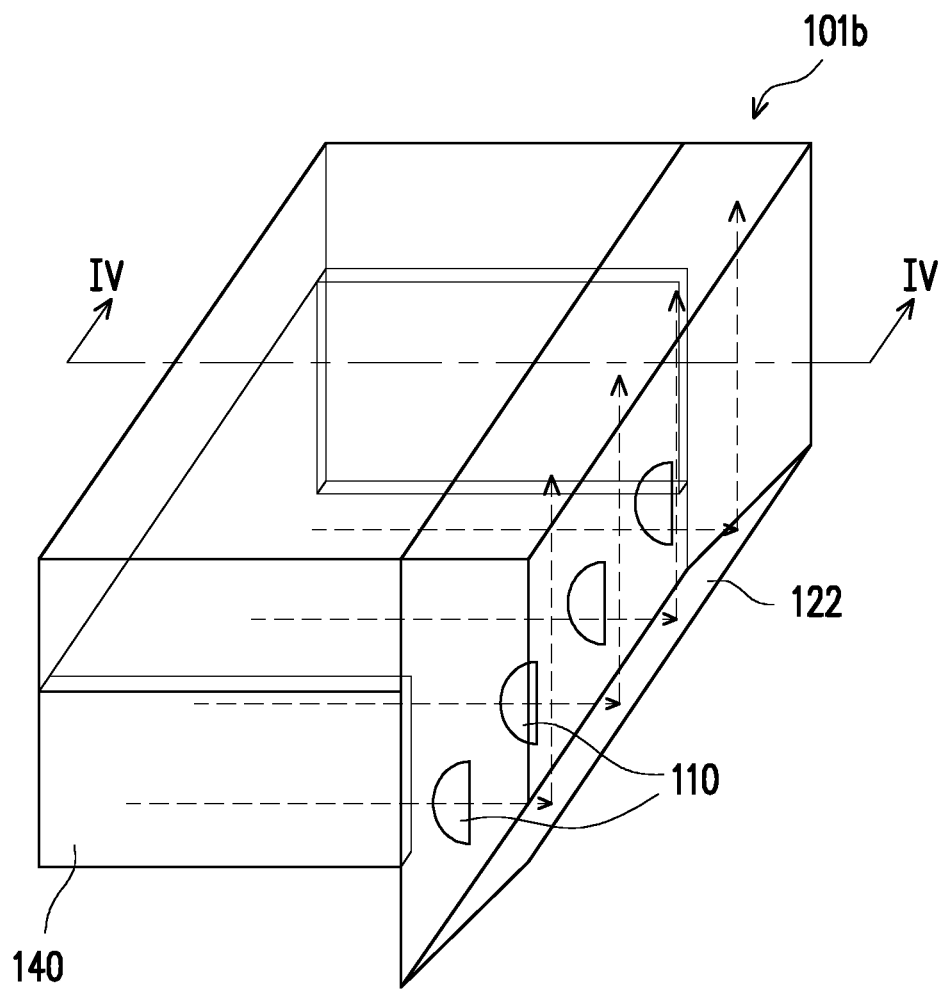
FIG. 5A is a schematic perspective view showing a test device according to still another embodiment of the disclosure.
Figure 5B:
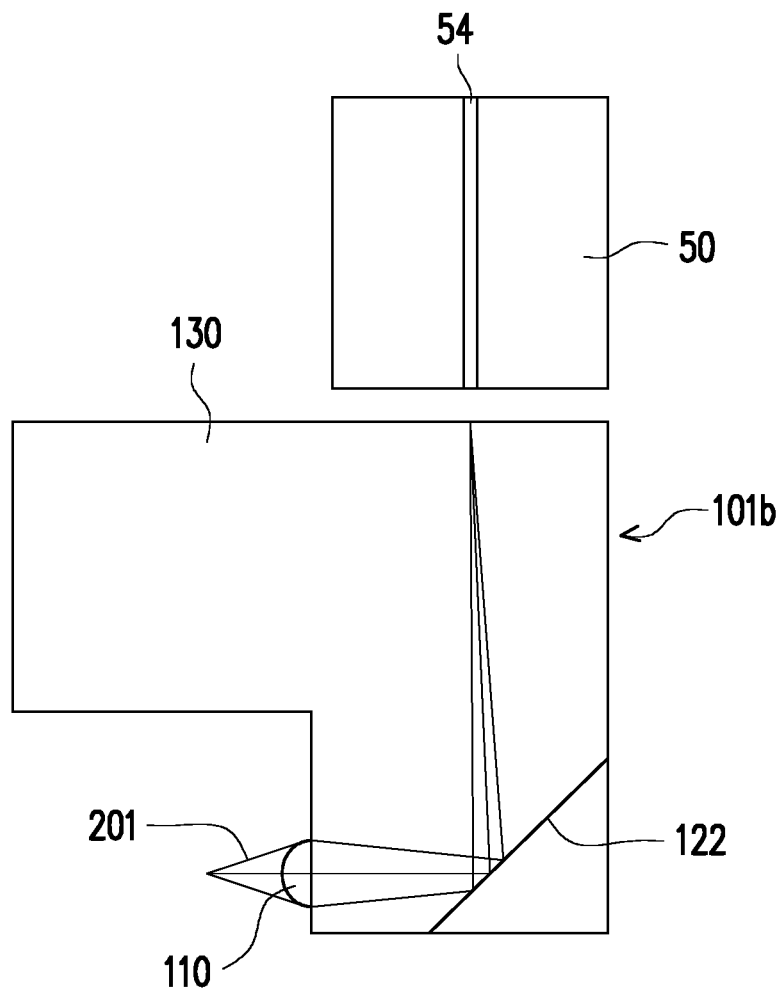
FIG. 5B is a schematic cross-sectional view showing the test device of FIG. 5A along line IV-IV.

FIG. 5A is a schematic perspective view showing a test device according to still another embodiment of the disclosure, and FIG. 5B is a schematic cross-sectional view showing the test device of FIG. 5A along line IV-IV. Referring to FIG. 5A and FIG. 5B, a test device 100b of the present embodiment is similar to the test device 100 of FIG. 1A to FIG. 3, and the main differences between the two are as follows. In the test device 100b of the present embodiment, an optical coupler 101b includes the first reflector 122 but does not include the second reflector 124 of FIG. 1A. The light 201 reflected by the first reflector 122 is transmitted upward to the fiber connector 50 located above the optical coupler 101b, or the light from the fiber connector 50 is transmitted downward to the first reflector 122 and reflected by the first reflector 122 to the focusing lens 110.

In summary of the above, in the test device and the heterogeneously integrated structure of the embodiments of the disclosure, since the optical coupler which may be optically aligned or heterogeneously integrated with the photonic IC is adopted, a simplified measurement process and good measurement quality can be achieved, or a simple architecture can be utilized to achieve good optical coupling to the outside.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A test device configured to test a photonic integrated circuit, the photonic integrated circuit comprising at least one waveguide edge coupler, the test device comprising:
    an optical coupler, configured on the photonic integrated circuit and optically aligned with the photonic integrated circuit, and comprising:
    at least one focusing lens, aligned with the at least one waveguide edge coupler, wherein the waveguide edge coupler and the focusing lens are arranged along an extending direction of a waveguide of the photonic integrated circuit;
    a first reflector, wherein a light from the waveguide edge coupler is focused by the focusing lens, reflected by the first reflector, and transmitted to a fiber connector in sequence, or a light from the fiber connector is reflected by the first reflector and focused onto the waveguide edge coupler by the focusing lens in sequence; and
    a light-transmitting medium covering the first reflector, wherein at least one curved surface of the light-transmitting medium forms the at least one focusing lens.

2. The test device according to claim 1, wherein the optical coupler further comprises a second reflector configured to reflect the light reflected by the first reflector to the fiber connector or configured to reflect the light from the fiber connector to the first reflector.

3. The test device according to claim 2, wherein an incident direction of the light which comes from the focusing lens and is incident on the first reflector is a same direction as an outgoing direction of the light which comes from the first reflector and is emitted from the second reflector, or an incident direction of the light which comes from the fiber connector and is incident on the second reflector is a same direction as an outgoing direction of the light which comes from the second reflector and is emitted from the first reflector.

4. The test device according to claim 2, wherein an incident direction of the light which comes from the focusing lens and is incident on the first reflector is an opposite direction of an outgoing direction of the light which comes from the first reflector and is emitted from the second reflector, or an incident direction of the light which comes from the fiber connector and is incident on the second reflector is an opposite direction of an outgoing direction of the light which comes from the second reflector and is emitted from the first reflector.

5. The test device according to claim 1, further comprising a support element connected to the light-transmitting medium, wherein by having the support element supported on a surface of the photonic integrated circuit, the test device fixes relative positions of the waveguide edge coupler and the focusing lens.

6. The test device according to claim 1, wherein a material of the light-transmitting medium comprises a polymer.

7. The test device according to claim 1, wherein the first reflector is inclined with respect to a traveling direction of the light emitted from or incident on the waveguide edge coupler.

8. The test device according to claim 1, wherein a light transmitted in the light-transmitting medium is an infrared light.

9. The test device according to claim 1, wherein the first reflector is a reflective coating film.

10. A heterogeneously integrated structure, comprising:
a photonic integrated circuit, comprising at least one waveguide edge coupler; and
an optical coupler, heterogeneously integrated onto the photonic integrated circuit and comprising:
at least one focusing lens aligned with the at least one waveguide edge coupler, wherein the waveguide edge coupler and the focusing lens are arranged along an extending direction of a waveguide of the photonic integrated circuit;
a first reflector, wherein a light from the waveguide edge coupler is focused by the focusing lens, reflected by the first reflector, and transmitted to a fiber connector in sequence, or a light from the fiber connector is reflected by the first reflector and focused onto the waveguide edge coupler by the focusing lens in sequence; and
a light-transmitting medium covering the first reflector, wherein at least one curved surface of the light-transmitting medium forms the at least one focusing lens.

11. The heterogeneously integrated structure according to claim 10, wherein the optical coupler further comprises a second reflector configured to reflect the light reflected by the first reflector to the fiber connector or configured to reflect the light from the fiber connector to the first reflector.

12. The heterogeneously integrated structure according to claim 11, wherein an incident direction of the light which comes from the focusing lens and is incident on the first reflector is a same direction as an outgoing direction of the light which comes from the first reflector and is emitted from the second reflector, or an incident direction of the light which comes from the fiber connector and is incident on the second reflector is a same direction as an outgoing direction of the light which comes from the second reflector and is emitted from the first reflector.

13. The heterogeneously integrated structure according to claim 11, wherein an incident direction of the light which comes from the focusing lens and is incident on the first reflector is an opposite direction of an outgoing direction of the light which comes from the first reflector and is emitted from the second reflector, or an incident direction of the light which comes from the fiber connector and is incident on the second reflector is an opposite direction of an outgoing direction of the light which comes from the second reflector and is emitted from the first reflector.

14. The heterogeneously integrated structure according to claim 10, further comprising a support element connected to the light-transmitting medium, wherein by having the support element supported on a surface of the photonic integrated circuit, the test device fixes relative positions of the waveguide edge coupler and the focusing lens.

15. The heterogeneously integrated structure according to claim 10, wherein a material of the light-transmitting medium comprises a polymer.

16. The heterogeneously integrated structure according to claim 10, wherein the first reflector is inclined with respect to a traveling direction of the light emitted from the waveguide edge coupler.

17. The heterogeneously integrated structure according to claim 10, wherein a light transmitted in the light-transmitting medium is an infrared light.

18. The heterogeneously integrated structure according to claim 10, wherein the first reflector is a reflective coating film.

* * * * *